(12) United States Patent
Tsorng et al.

(10) Patent No.: US 10,701,831 B1
(45) Date of Patent: Jun. 30, 2020

(54) COMPUTER COMPONENT COVER IN CHASSIS

(71) Applicant: QUANTA COMPUTER INC., Taoyuan (TW)

(72) Inventors: Yaw-Tzorng Tsorng, Taoyuan (TW); Shin-Ming Su, Taoyuan (TW); Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/263,605

(22) Filed: Jan. 31, 2019

(51) Int. Cl.
- *H05K 7/20* (2006.01)
- *H05K 5/02* (2006.01)
- *G06F 1/20* (2006.01)

(52) U.S. Cl.
CPC ....... *H05K 7/20163* (2013.01); *H05K 5/0226* (2013.01); *H05K 5/0239* (2013.01); *G06F 1/20* (2013.01); *H05K 7/20145* (2013.01)

(58) Field of Classification Search
CPC ... H05K 7/20145; H05K 7/20163; G06F 1/20
USPC ....... 361/679.49–679.51, 695–697; 165/80.1–80.3; 454/184
See application file for complete search history.

(56) References Cited

U.S. PATENT DOCUMENTS

| | | | | |
|---|---|---|---|---|
| 6,230,750 B1 * | 5/2001 | Lessard | ............... | E04F 17/04 138/149 |
| 6,621,693 B1 | 9/2003 | Potter et al. | | |
| 7,408,773 B2 * | 8/2008 | Wobig | ............... | G06F 1/20 165/104.33 |
| 2004/0004812 A1 * | 1/2004 | Curlee | ............... | G06F 1/181 361/679.48 |
| 2004/0027808 A1 | 2/2004 | Rumney | | |
| 2011/0128687 A1 | 6/2011 | Chen et al. | | |
| 2013/0029584 A1 * | 1/2013 | Chan | ............... | H05K 7/20145 454/367 |
| 2013/0148297 A1 * | 6/2013 | Wei | ............... | H05K 7/20727 361/695 |
| 2014/0133086 A1 | 5/2014 | Chen et al. | | |
| 2016/0021778 A1 | 1/2016 | Chen et al. | | |

FOREIGN PATENT DOCUMENTS

TW 201325416 A1 6/2013

OTHER PUBLICATIONS

Extended European Search Report for EP Application No. 19195048.4, dated Mar. 19, 2020.
TW Office Action for Application No. 108124760, dated Apr. 21, 2020, w/ First Office Action Summary.

* cited by examiner

*Primary Examiner* — Zachary Pape
(74) *Attorney, Agent, or Firm* — Nixon Peabody LLP

(57) ABSTRACT

The present disclosure provides a cover configured to fit over computer components in a computer chassis. The cover can have a plurality of doors located over the computer components such that the computer components can be easily inserted or removed from the chassis when a corresponding door is open. The cover can be shaped in a such a way so as to define airflow passages around the computer components. The doors can be configured to pivot open, slide open, or snap into and out of the cover.

11 Claims, 8 Drawing Sheets

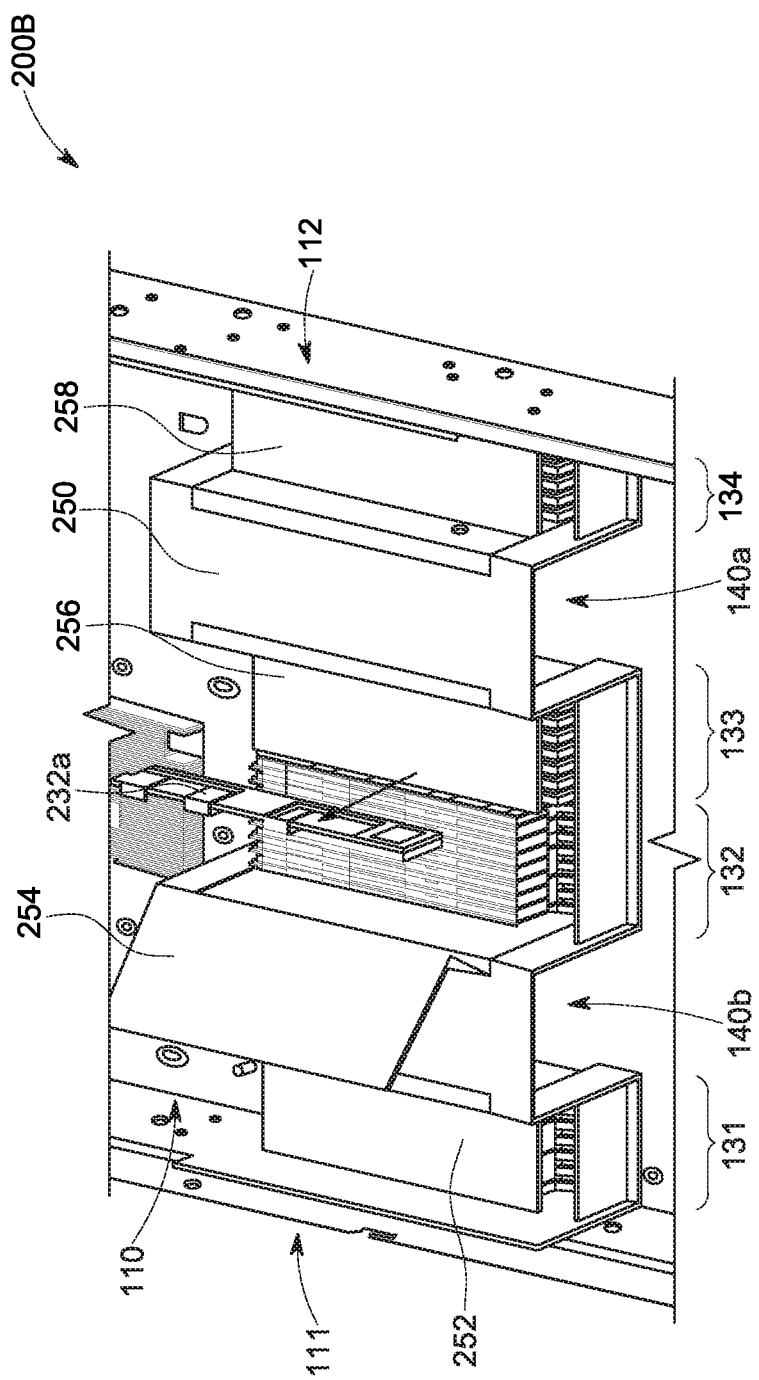

COMPUTER COMPONENT COVER IN CHASSIS

FIELD

The present disclosure relates to a cover which allows access to computer components housed in a computing device.

BACKGROUND

Computer chassis provide slots to hold a variety of computer components. Some of the computer components can be protected by a cover. The cover can prevent external air and debris from interacting with the covered components. The cover can also guide airflow through the computer chassis. For example, a cover can prevent external airflow from interacting with a covered component, while also guiding internal airflow over the covered component to promote cooling. Conventional covers are typically a single element which is coupled to the computer chassis. The cover can extend the entire width of the chassis and cover several rows of computer components.

However, such conventional covers can be unwieldy, especially when a user wants to access a covered component for repairs or replacements. In order to access any covered components, the entire cover must be removed from the chassis. This can be time-consuming and inconvenient when, for example, only one component requires replacement.

Therefore, what is needed is a cover that allows for access to one or more covered component without requiring removal of the entire chassis cover.

SUMMARY

The various examples of the present disclosure are directed towards a computer device. The computer device can have a housing, one or more components, and a cover. Both the one or more components and the cover can be located in the housing. The cover can be configured to cover at least one of the components to yield at least one covered component. The cover can include an opening with at least one door. The door can be positioned over the at least one covered component. The door can provide an open position and a closed position. The open position can allow insertion or removal of the at least one covered component without repositioning the cover, while the closed position prohibits insertion or removal of the at least one covered component.

In some examples, the cover can define at least one airflow passage around the at least one covered component.

In some examples, the at least one door can define airflow surfaces for the cover when the door is in a closed position.

In some examples, the at least one door can include a first groove, and the cover can include a corresponding second groove. The first and second groove can slidably connect to couple the at least one door with the cover.

In some examples, the computing device can further include a coupling mechanism to attach the at least one door to the cover.

In some examples, the coupling mechanism can cause the at least one door to slide along the cover. This sliding movement can transition the at least one door between the closed position and the open position.

In some examples, the coupling mechanism can include a hinge mechanism. The hinge mechanism can cause the at least one door to pivot away from the housing. The at least one door can pivot along a length of the at least one covered component.

In some examples, the coupling mechanism can include a first connector on the at least one door and a second connector on the cover. The first connector and the second connector can snap into a mating position.

In some examples, the at least one door can include a plurality of panels. A paneled door can alternate between the open position and the closed position by folding each panel in the plurality of panels adjacent to the cover.

In some examples, the at least one computer component can include at least one of a computer memory device, a graphics processing unit, a central processing unit, and a computer fan.

A second embodiment of the present disclosure provides for a cover including at least one opening, at least one airflow passage, and at least one door. The cover can be placed in a computer chassis. The openings can extend over at least one computer component in the computer chassis. Each door of the at least one door can correspond to one of the openings. Each door can provide an open position and a closed position. The open position allows insertion or removal of a computer component without repositioning the cover. The closed position prohibits insertion or removal of a computer component. The airflow passage can direct air around a computer component.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 2B shows an exemplary chassis and cover assembly with a door in an open position, according to an embodiment of the present disclosure.

DETAILED DESCRIPTION

Figure 1A:
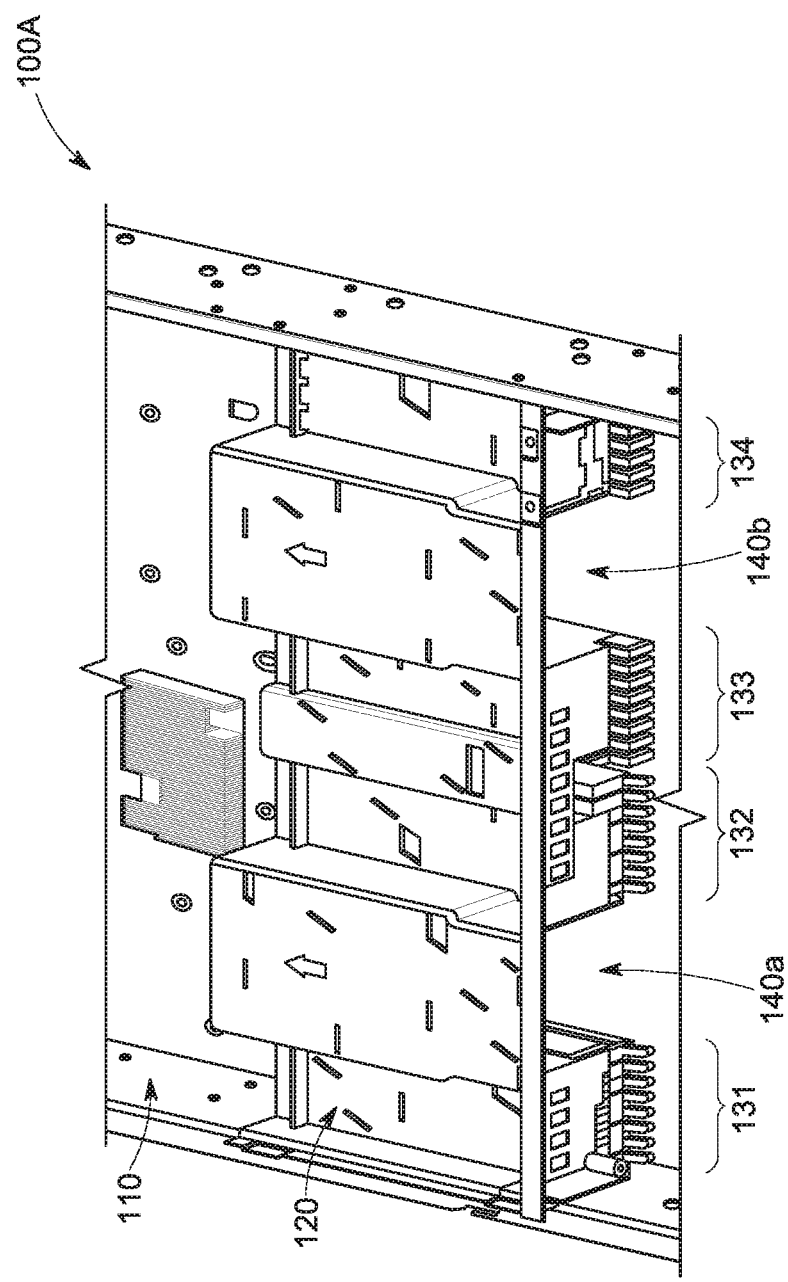
FIG. 1A shows a conventional computer chassis and cover, according to the prior art.

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure is directed to a cover configured to fit over computer components in a computer chassis. The cover can have a plurality of doors located over the computer components such that the computer components can be easily inserted or removed from the chassis when a corresponding door is open. The cover can further be shaped in such a way so as to define airflow passages around the computer components. Therefore, the cover allows a user to interact with covered components by opening a door on the cover which is adjacent to the covered components. Therefore, a user does not need to remove the entire cover assembly when replacing or repairing a covered component.

FIG. 1A shows a conventional computer chassis and cover assembly 100A, according to the prior art. Assembly 100A can include a computer chassis 110; a chassis cover 120; rows of computer components 131, 132, 133, and 134; and airflow passages 140a and 140b. The computer chassis 110 can serve as a housing for several rows of computer components 131, 132, 133, and 134. Although the lengths and spacings of the rows 131, 132, 133, and 134 are pictured as uniform, the rows can vary in size and in which components are located in the row. Exemplary components can include computer memory devices, graphics processing units, central processing units, or computer fans. In some cases, different rows can hold different computer components.

Assembly 100A can include a chassis cover 120. The chassis cover 120 is a single element which can attach to the computer chassis 110 and cover the rows of computer components 131, 132, 133, and 134. Such a cover can provide protection against airflow and dust, and can also be shaped to provide airflow passages 140a and 140b in the computer chassis 110. Airflow passages 140a and 140b can direct airflow over or around the rows of computer components 131, 132, 133, and 134 in order to provide effective cooling of the components.

Figure 1B:
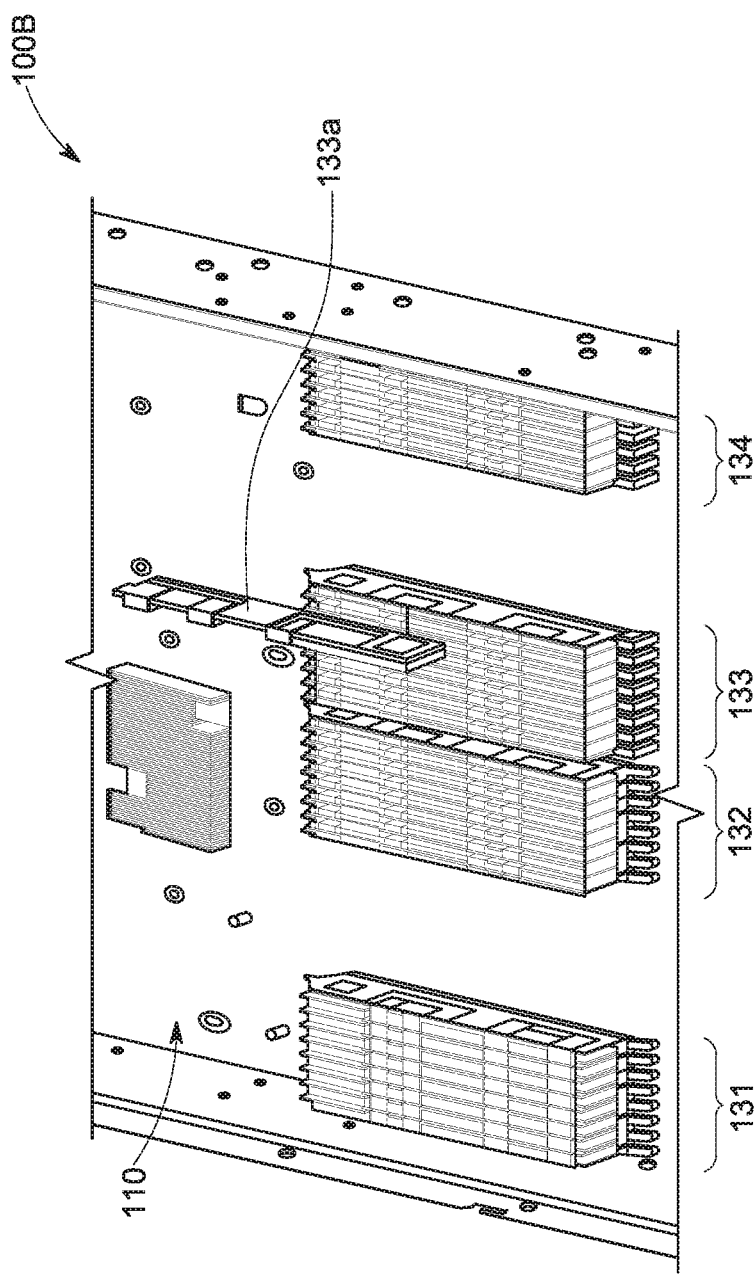
FIG. 1B shows a conventional computer chassis where a component can be removed, according to the prior art.

FIG. 1B shows a conventional computer chassis and cover assembly 100B with many components and labels similar to FIG. 1A. Notably, FIG. 1B shows the computer chassis 110 without a chassis cover 120 (in FIG. 1A). The chassis cover needs to be entirely removed to allow any component (e.g. component 133a) to be removed from its slot on the computer chassis 110. In many circumstances, a user might want to replace or repair a single component. Removing the entire chassis cover 120 can be unwieldy and inconvenient. In some cases, the chassis cover 120 can have complicated or secure attachment methods that require time and/or additional tools. For example, specific components in the rows 131, 132, 133, and 134 can have cables, batteries, or additional components which attach to or interfere with the chassis cover 120. These cables, batteries, and other components can make it even more complicated and time-consuming to remove the chassis cover 120 in order to replace just a single component (e.g. component 133a). Therefore, FIGS. 1A and 1B show the inconvenience of conventional chassis covers which do not allow a user to interact with a single component on the chassis unless the cover is completely removed.

Figure 2A:
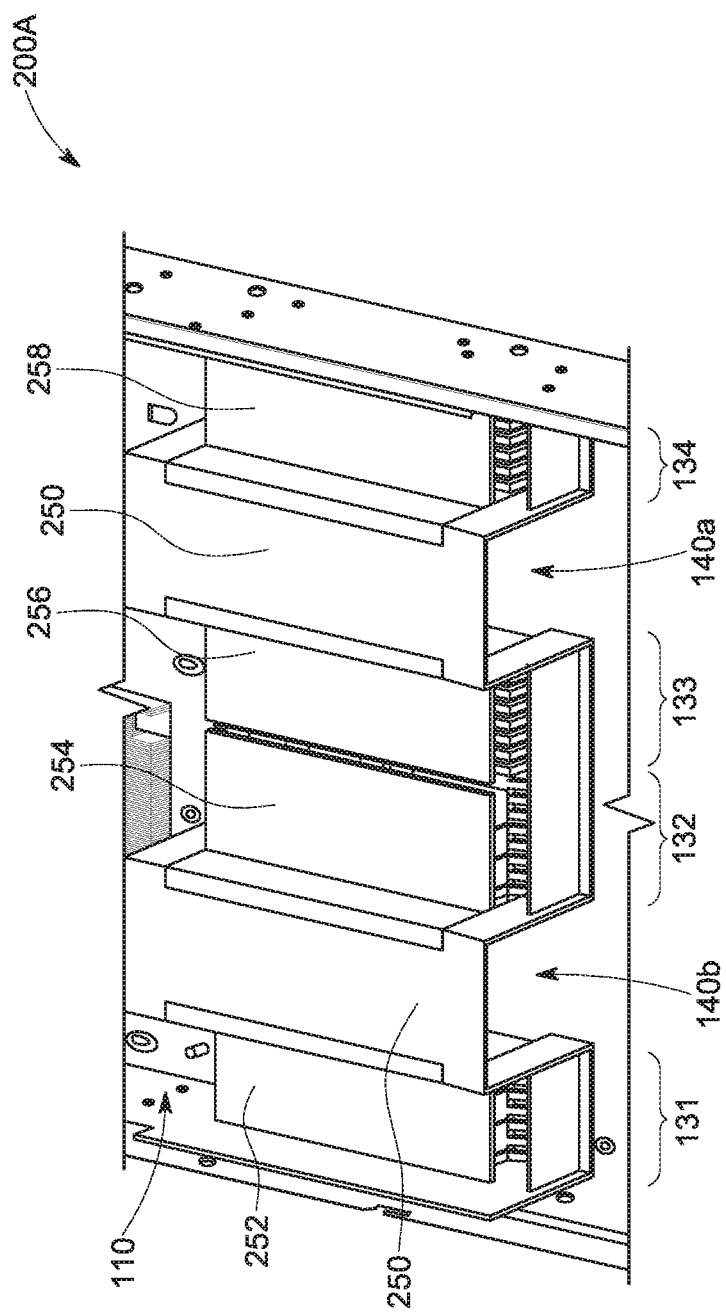
FIG. 2A shows an exemplary chassis and cover assembly, according to an embodiment of the present disclosure.

In response to the limitations of conventional chassis covers, the present disclosure provides a cover assembly with doors or other types of access features. FIG. 2A shows an exemplary chassis and cover assembly 200A, according to an embodiment of the present disclosure. Assembly 200A includes labeled components similar to assemblies 100A and 100B (in FIGS. 1A-1B), and can further include cover 250. As in the assemblies 100A and 100B, the cover 250 can be shaped to direct airflow as needed through assembly 200A. However, cover 250 is designed to include doors 252, 254, 256, and 258, according to an embodiment of the present disclosure. Doors 252, 254, 256, and 258 can be placed in strategic locations to allow access to the rows of computer components 131, 132, 133, and 134, without removing the entire cover 250 from the assembly 200A. As FIG. 2A shows, cover 250 can still provide airflow passages 140a and 140b between rows of computer components 131, 132, 133, and 134. Doors 252, 254, 256, and 258 can be placed over each row 131, 132, 133, and 134, and sized according to shape and dimensions of each row. Additionally, doors 252, 254, 256, and 258 can be in a closed position to define airflow surfaces along the rows 131, 132, 133, and 134, to direct airflow above or below the components according to system requirements. As FIG. 2A shows, all components are inaccessible when the doors 252, 254, 256, and 258 are in a closed position.

Although FIG. 2B shows four doors 252, 254, 256, and 258, more or fewer doors can be included in cover 250. In addition, some rows 131, 132, 133, and 134 can have no door over their components. Rows 131, 132, 133, and 134 can hold components such as a computer memory device, a graphics processing unit, a central processing unit, and a computer fan. Although each row 131, 132, 133, and 134 is shown to be uniform in FIG. 2B, the rows can be of varying size and dimensions, according to which components are held. The doors 252, 254, 256, and 258 can vary according to the dimensions of the corresponding row 131, 132, 133, and 134.

FIG. 2B shows an exemplary chassis and cover assembly 200B with door 254 in an open position, according to an embodiment of the present disclosure. Assembly 200B includes labeled components similar to FIG. 2A. FIG. 2B demonstrates that door 254 can pivot away from chassis 110 into an open position, thereby allowing a computer component 232a to be removed from row 132. The cover 250 can therefore remain in place on the chassis 110 while individual doors 252, 254, 256, and 258 transition to an open position to allow accessing, insertion, or removal of computer components.

FIG. 2B demonstrates a hinging movement of door 254. The hinging movement can be provided by a coupling mechanism, and can allow the doors 252, 254, 256, or 258 to pivot along a length of the computer component. Additional door movements and mechanisms are discussed with respect to FIGS. 3A-3B.

Figure 2C:
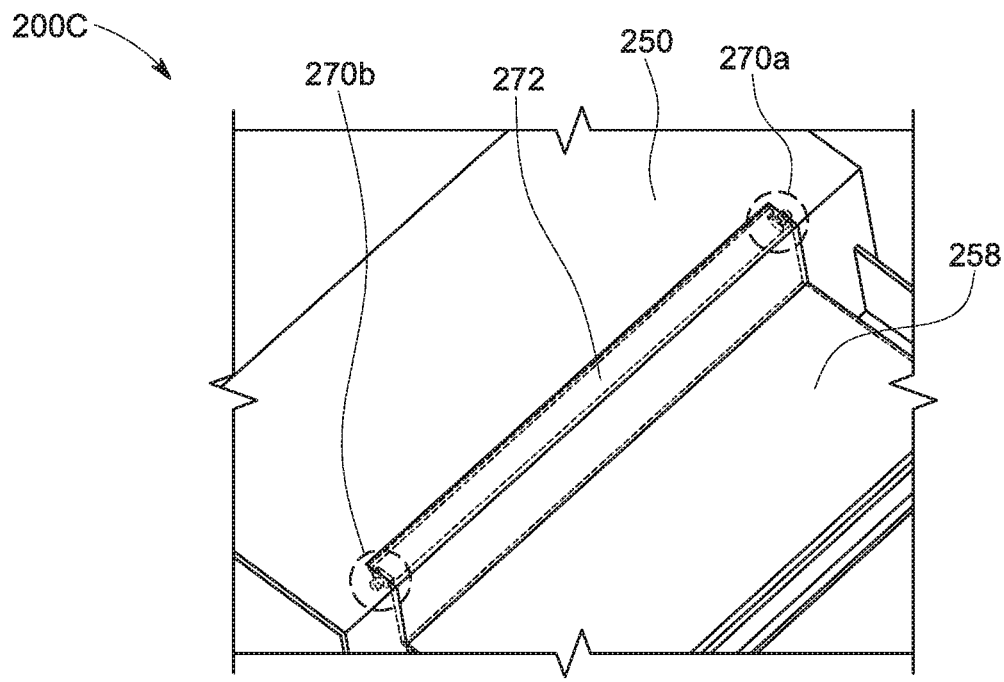
FIG. 2C shows an exemplary connector location on a door, according to an embodiment of the present disclosure.
Figure 2D:
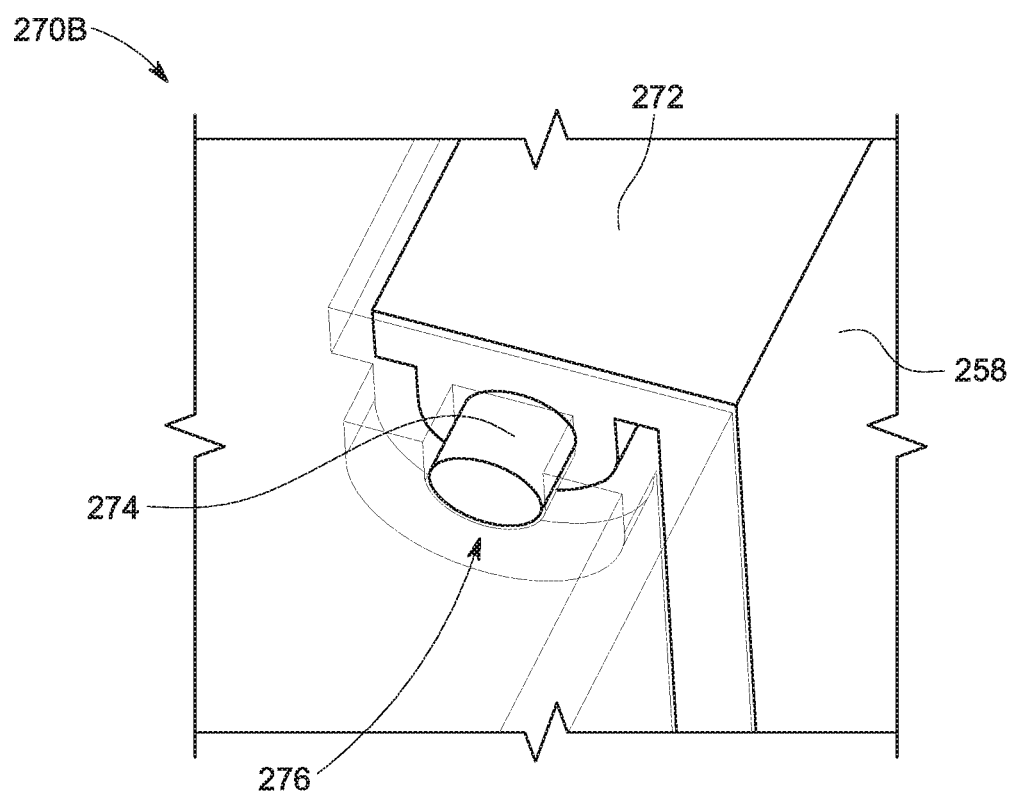
FIG. 2D shows an exemplary connector design, according to an embodiment of the present disclosure.

FIG. 2C shows an exemplary connector location on a door in perspective 200C, according to an embodiment of the present disclosure. For example, a door (e.g. door 258) can have an edge 272 which interfaces with the cover 250 by connector elements 270a and 270b. FIG. 2D shows a close-up view of connector elements 270, where each connector element 270 can have a male connector 274 and a female connector 276. The male connector 274 can rotate about female connector 276 when the door (e.g. door 258) opens. In some examples, the male connector 274 can removably couple and uncouple with female connector 276 (e.g., by snapping into and out of female connector 276).

Although an exemplary design for connector elements 270 is shown in FIG. 2D, the present disclosure contemplates that any design can be used so long as the design allows for the doors 252, 254, 256, or 258 to connect and rotate with respect to the cover 250.

Figure 3A:
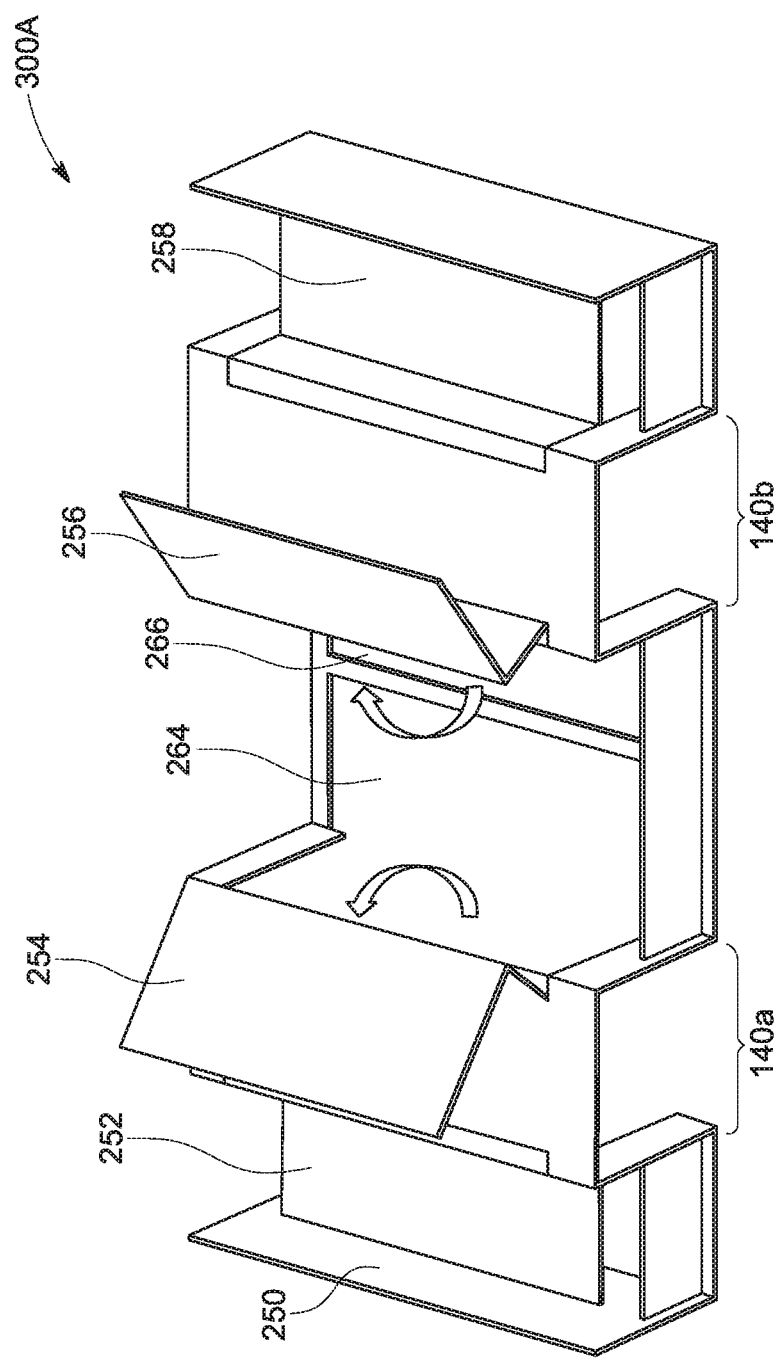
FIG. 3A shows an exemplary cover with two doors in an open position, according to an embodiment of the present disclosure.

FIG. 3A shows an exemplary cover and door assembly 300A with two doors 254 and 256 in an open position, according to an embodiment of the present disclosure. FIG. 3A includes labeled components similar to FIGS. 2A and 2B. FIG. 3A shows the rotation of doors 254 and 256 in opposite directions to each other, such that the opening of door 254 does not interfere with door 256. Therefore, open doors 254 and 256 can respectively yield openings 264 and 266. Additionally, doors 258 and 252 can be configured to pivot inward into the chassis 110 (in FIGS. 1A-1B) so as to not interfere with a respective first wall 111 or second wall 112 (both in FIG. 2B) of the chassis 110.

Figure 3B:
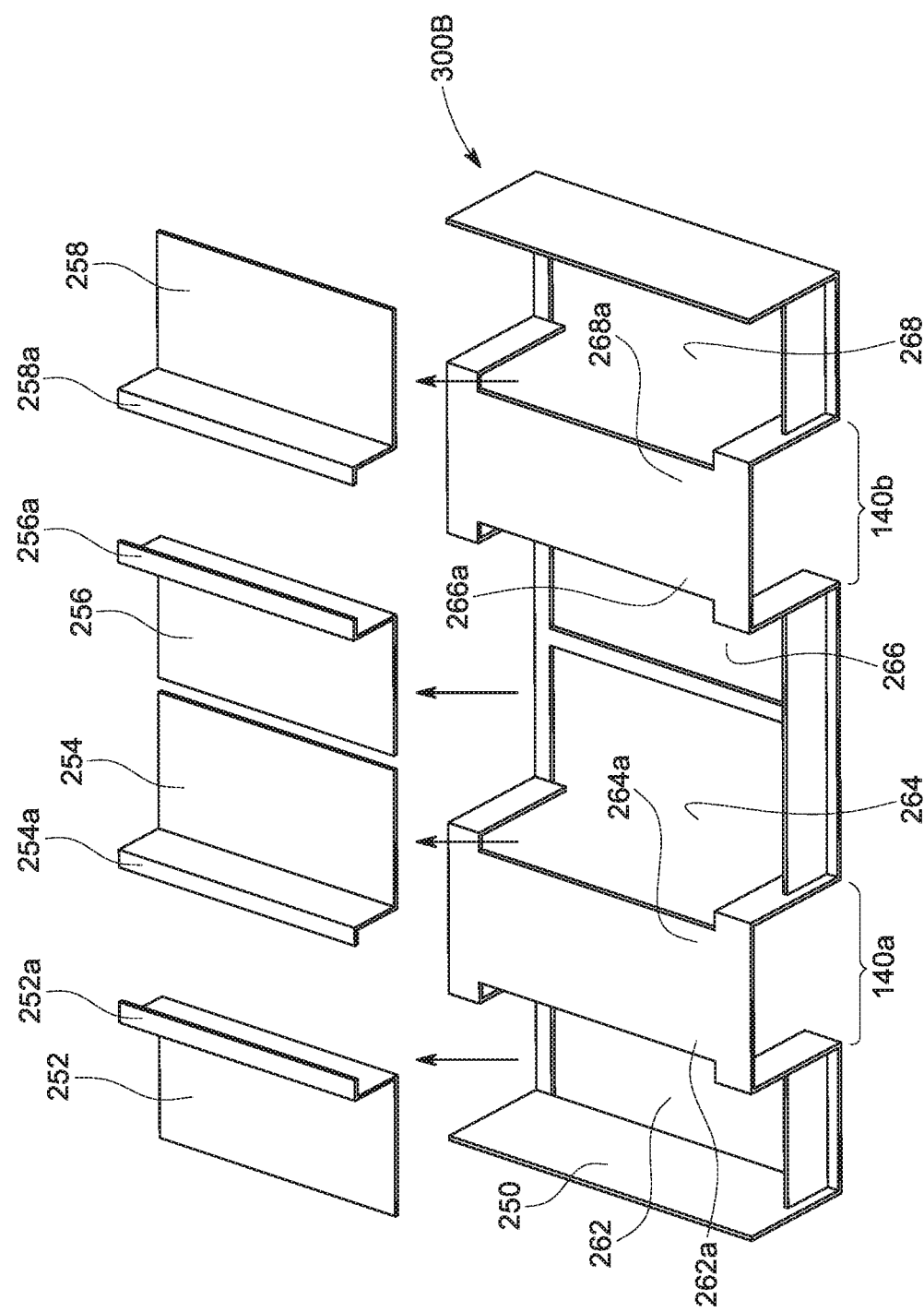
FIG. 3B shows an exemplary cover with removable doors, according to an embodiment of the present disclosure.

FIG. 3B shows an exemplary cover and door assembly 300B with removable doors, according to an embodiment of the present disclosure. FIG. 3B shows that in some examples of the present disclosure, doors 252, 254, 256, and 258 can be completely removed from cover 250, for example, by a sliding movement. This sliding movement does not require the use of external tools. In other examples, the doors 252, 254, 256, and 258 can have first connectors along a first edge 252a, 254a, 256a, and 258a, which connect to respective second connectors along inside edges 262a, 264a, 266a, and 268a of cover 250. In some configurations, the doors 252, 254, 256, and 258 can snap into position on the chassis cover 250 via the first and second connectors.

In other examples, the first edges 252a, 254a, 256a, and 258a can have a first groove which corresponds to second grooves along inside edges 262a, 264a, 266a, and 268a. These grooves can allow doors 252, 254, 256, and 258 to slidably connect with chassis cover 250.

In other examples, each door 252, 254, 256, and 258 can include a plurality of segments. Each segment of a door 252, 254, 256, and 258 can be configured to fold adjacent to other segments of the same door to reveal openings 262, 264, 266, and 268. For example, the segments can fold up over air passage ways 140a and 140b (both in FIG. 3A).

In other examples, doors 252 and 254 can be configured to slide over air passage 140a when transitioning between an open and closed position. Doors 256 and 258 can be configured to similarly slide over air passage 140b.

Figure 4:
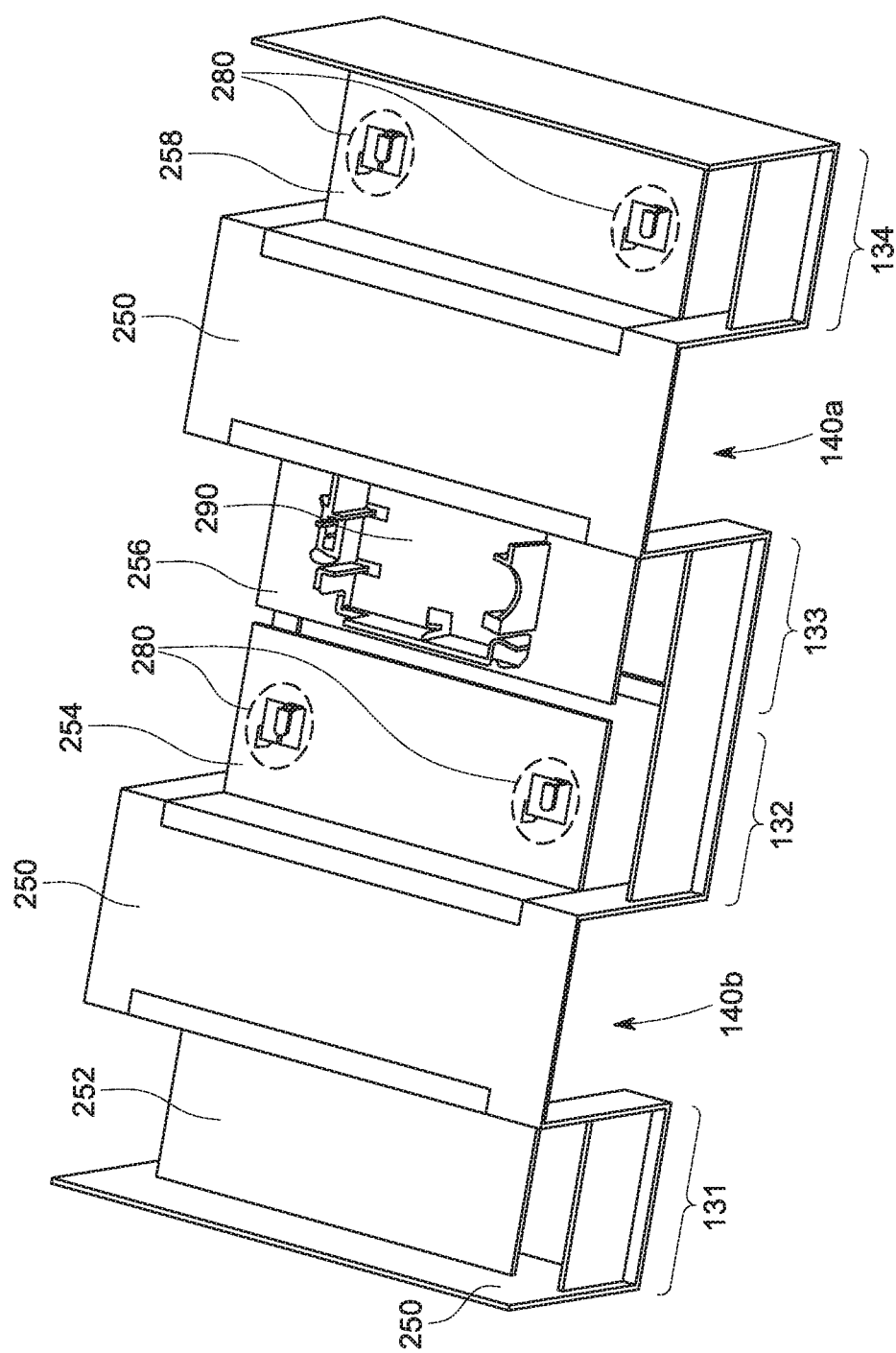
FIG. 4 shows an exemplary cover with additional modifications, according to an embodiment of the present disclosure.

FIG. 4 shows an exemplary cover with additional modifications, according to an embodiment of the present disclosure. For example, cover 250 can have cable hooks 280 and an attachment 290. Although cable hooks 280 are shown on doors 254 and 258, cable hooks 280 can be located on any of the doors 252, 254, 256, or 258. Although two cable hooks 280 are shown per door, there can be any number of cable hooks 280 on the doors 252, 254, 256, or 258. Cable hooks 280 can allow cables to attach to the top of doors 252, 254, 256, and 258 or allow cables to go through doors 252, 254, 256, and 258 to attach to rows of computer components 131, 132, 133, and 134. The attachment 290 can be a battery carrier or any holding for a computer component.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A computing device, comprising:
  a housing;
  one or more components disposed in the housing; and
  a cover disposed in the housing, the cover being configured to cover at least one of the components to yield at least one covered component and being configured to define airflow surfaces for at least one airflow passage around the at least one covered component,
  wherein the cover comprises an opening with at least one door positioned over the at least one covered component and only partially positioned over the at least one airflow passage, wherein a first door of the at least one door partially positioned over a respective airflow passage of the at least one airflow passage only defines part of a top airflow surface for the respective airflow passage,
  wherein the opening and the at least one door are configured to provide an open position and a closed position, wherein the open position allows insertion or removal of the at least one covered component without repositioning the cover, wherein the closed position prohibits insertion or removal of the at least one covered component, and wherein a height of the respective airflow passage remains unchanged when the first door transitions from the open position to the closed position.

2. The computing device of claim 1, wherein the at least one airflow passage defined by the cover does not include any of the at least one covered component.

3. The computing device of claim 1, wherein the at least one door defines parts of the airflow surfaces for the at least one airflow passage when the at least one door is in a closed position.

4. The computing device of claim 1, further comprising a coupling mechanism, wherein the coupling mechanism attaches the at least one door to the cover.

5. The computing device of claim 4, wherein the coupling mechanism is configured to allow the at least one door to slide along the cover while transitioning between the closed position and the open position.

6. The computer chassis of claim 4, wherein the coupling mechanism comprises a hinge mechanism such that the at least one door pivots away from the housing, along a length of the at least one covered component.

7. The computer chassis of claim 4, wherein the coupling mechanism comprises a first connector on the at least one door and a second connector on the cover, wherein the first connector and the second connector are configured to snap into a mating position.

8. The computing device of claim 1, wherein the at least one door further comprises a plurality of panels.

9. The computing device of claim 8, wherein the at least one door is configured to alternate between the open position and the closed position by folding each panel in the plurality of panels adjacent to the cover.

10. The computer chassis of claim 8, wherein the at least one covered component comprises at least one of a computer memory device, a graphics processing unit, a central processing unit, and a computer fan.

11. A cover, comprising:
 at least one opening, wherein each opening of the at least one opening is configured to extend over at least one computer component;
 at least one airflow passage, wherein each airflow passage of the at least one airflow passage is configured to direct air around the at least one computer component; and
 at least one door only partially positioned over the at least one airflow passage, wherein each door of the at least one door corresponds to one opening of the at least one opening and is configured to provide an open position and a closed position, wherein the open position allows insertion or removal of the at least one computer component without repositioning the cover, wherein the closed position prohibits insertion or removal of the at least one computer component, wherein a first door of the at least one door partially positioned over a respective airflow passage of the at least one airflow passage only defines part of a top airflow surface for the respective airflow passage, and wherein a height of the respective airflow passage remains unchanged when the first door transitions from the open position to the closed position.

* * * * *